(12) United States Patent
Krone

(10) Patent No.: US 7,933,725 B2
(45) Date of Patent: Apr. 26, 2011

(54) USING SENSOR SPECTRAL ENERGY TO DETECT AND/OR ISOLATE SENSOR FAULTS

(75) Inventor: Scott Kevin Krone, Wentzville, MO (US)

(73) Assignee: The Boeing Company, Chicago, IL (US)

( * ) Notice: Subject to any disclaimer, the term of this patent is extended or adjusted under 35 U.S.C. 154(b) by 180 days.

(21) Appl. No.: 11/931,995

(22) Filed: Oct. 31, 2007

(65) Prior Publication Data

US 2009/0112498 A1   Apr. 30, 2009

(51) Int. Cl.
*G01R 13/00* (2006.01)
(52) U.S. Cl. .......................................... 702/66; 702/185
(58) Field of Classification Search .................... 702/34, 702/35, 75–77, 141, 144
See application file for complete search history.

(56) References Cited

U.S. PATENT DOCUMENTS

| | | | |
|---|---|---|---|
| 4,337,516 A * | 6/1982 | Murphy et al. | 702/183 |
| 4,697,768 A | 10/1987 | Klein | |
| 5,671,247 A * | 9/1997 | Souissi et al. | 375/144 |
| 2002/0188423 A1* | 12/2002 | Gross et al. | 702/182 |

OTHER PUBLICATIONS

Munther A. Hassouneh, Hsien-Chiarn Lee and Eyad H. Abed, "Washout Filters in Feedback Control: Benefits, Limitations and Extensions", Proceeding of the 2004 American Control Conference, Boston, MA, Jun. 30-Jul. 2, 2004, pp. 3950-3955.

* cited by examiner

*Primary Examiner* — Manuel L Barbee
(74) *Attorney, Agent, or Firm* — Harness, Dickey & Pierce, P.L.C.

(57) ABSTRACT

A method of detecting and/or isolating a fault of a sensor in a system in substantially real time or in non-real time (e.g., using off-line analysis). A spectral energy of a signal of the sensor is determined over a predetermined range of frequencies within a window of samples of the signal. The determined spectral energy is evaluated for consistency with a substantially current state of the system.

19 Claims, 9 Drawing Sheets

Fig. 4B

USING SENSOR SPECTRAL ENERGY TO DETECT AND/OR ISOLATE SENSOR FAULTS

STATEMENT REGARDING FEDERALLY SPONSORED RESEARCH OR DEVELOPMENT

This invention was made with Government support under Contract Number N00383-06-D-001J 0002 awarded by the United States Navy. The Government has certain rights in this invention.

FIELD

The present disclosure relates to detection and/or isolation of faults in sensors used in control system environments.

BACKGROUND

The statements in this section merely provide background information related to the present disclosure and may not constitute prior art. Aircraft are typically provided with two or more angle-of-attack (AOA) sensors, at least one on each side of the aircraft fuselage. AOA sensors are used to augment aircraft stability in flight and to enhance the flying qualities of the aircraft. AOA sensors are also utilized to inform the pilot of an impending adverse condition, e.g., stall. AOA sensor failure detection typically involves a comparison of left and right sensor signal amplitudes to determine whether ambiguity exists between them. If ambiguity persists, it may be concluded that an AOA sensor failure occurred. Since the fault detection process typically involves a simple comparison of the two signals, it can be difficult if not impossible to determine which of the two AOA sensor signals is incorrect.

SUMMARY

In one implementation, the disclosure is directed to a method of detecting and/or isolating a fault of a sensor in a system. The energy of a signal of the sensor is determined over a predetermined range or spectrum of frequencies within a window of samples of the signal. The determined spectral energy is evaluated for consistency with a substantially current state of the system.

In another implementation, the disclosure is directed to an apparatus for detecting and/or isolating a fault of a sensor in a system. The apparatus includes a processor and memory configured to determine a spectral energy of a signal of the sensor over a predetermined range of frequencies within a floating window of samples of the signal. The processor and memory are further configured to evaluate the determined spectral energy for consistency with a substantially current state of the system.

In yet another implementation, the disclosure is directed to a computer-readable medium for detecting and/or isolating a fault of a sensor in a system. The medium includes instructions executable by a computer to determine a spectral energy associated with a signal of the sensor over a predetermined range of frequencies within a window of samples of the signal, and evaluate the determined spectral energy for consistency with a substantially current state of the system.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 4B is a graph of a circular energy buffer, in accordance with one implementation of the disclosure, for the window shown in FIG. 4A;

DETAILED DESCRIPTION

The following description is merely exemplary in nature and is not intended to limit the present disclosure, application, or uses. Although various implementations are described in the disclosure with reference to angle-of-attack sensors on aircraft, the disclosure is not so limited. The disclosure may be implemented in connection with many different types of sensors and systems, which may or may not be feedback systems, and in many other system environments besides aeronautical environments.

In various implementations of the disclosure, methods and systems are provided for detecting and/or isolating a sensor that is not working properly. In some implementations, spectral energy associated with a signal of a sensor of a system may be computed and compared to the spectral energy associated with another signal of the system. The other signal is related to the sensor signal through some physical relationship and also is related to current system state. In such manner, a fault of the sensor may be isolated and/or detected. Such implementations can be particularly useful when a degraded or failed sensor would be expected to exhibit a reduced signal bandwidth with respect to frequency and, consequently, a reduced spectral energy (that is, significant degradation in signal energy would indicate a failure). Additionally, where redundant sensors of the same type are available, spectral energy associated with the sensor outputs could be compared to determine which sensor is failed.

Generally, in state-space system descriptions, the term "state variable" is used to refer to any one of a minimum set of independent system variables, the knowledge of values for which at a time $t_0$, together with any inputs to the system for a time t greater than or equal $t_0$, allow behavior of the system to be determined for t greater than or equal to $t_0$. A "state" of a system is known when each "state variable" of such a minimum set is known. In the present disclosure and claims, the term "state indicator" may be used to refer to state variables and also to variables that may be dependent on one or more state variables. For example, in a system for which velocity is defined as a state variable, both velocity and acceleration (which is dependent on velocity) could be referred to as "state indicators".

Figure 1:
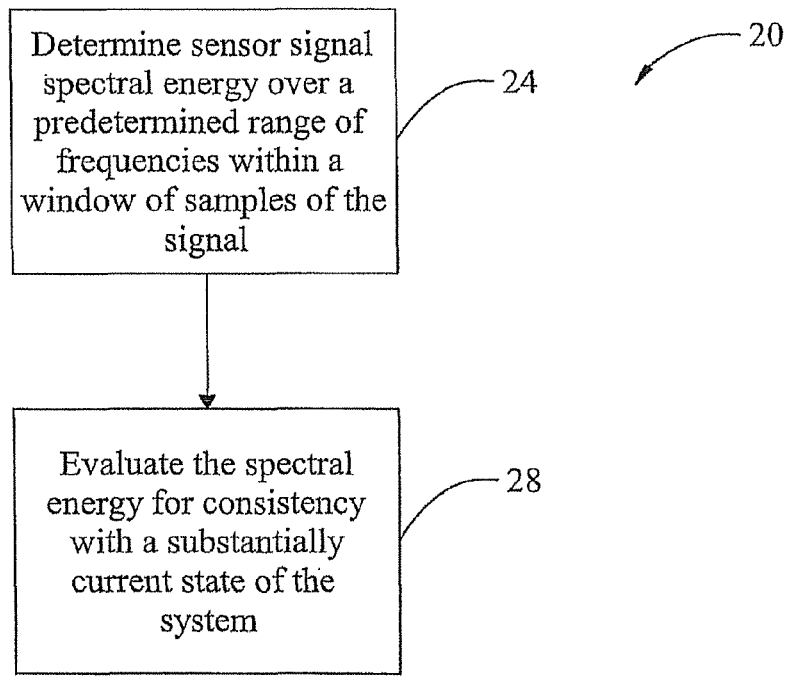
FIG. 1 is a flow diagram of a method of detecting and/or isolating a fault of a sensor in a system in accordance with one implementation of the disclosure.
Figure 1:
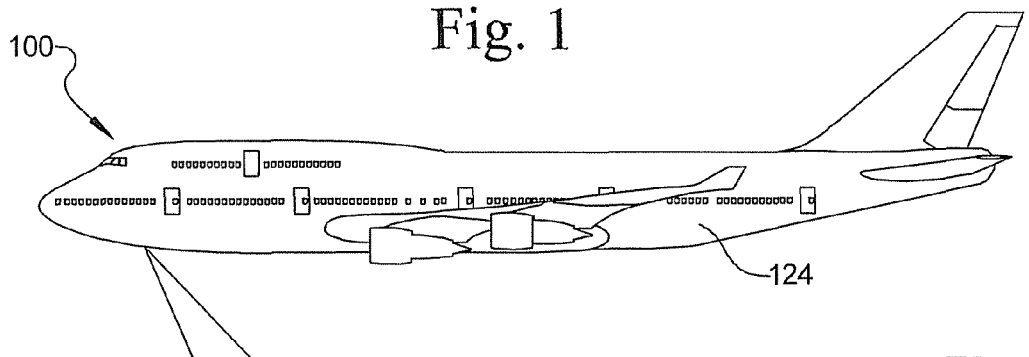

One implementation of a method of detecting and/or isolating a fault of a sensor in a system is indicated generally in FIG. 1 by reference number 20. The method 20 may be performed in substantially real time. Additionally or alternatively, the method 20 may be performed in non-real time, for example, using off-line analysis. In process 24 the energy of a signal of the sensor is determined over a predetermined range or spectrum of frequencies within a window of samples of the signal. In process 28 the determined spectral energy is evaluated for consistency with a substantially current state of the system. It should be noted generally that the term "process" may be used in the disclosure and claims to refer to a single operation or a plurality of operations.

Figure 2:
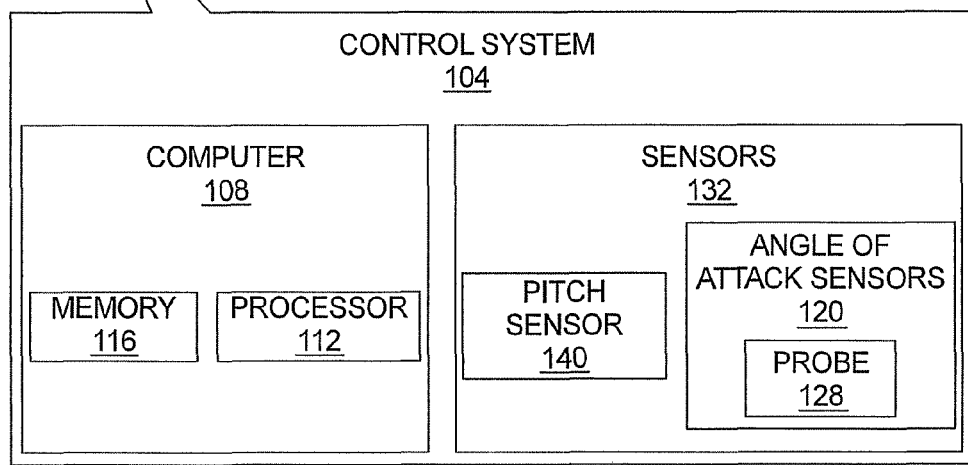
FIG. 2 is a diagram of an aircraft including an apparatus for detecting and/or isolating a fault of a sensor in substantially real time in accordance with one implementation of the disclosure.

The method 20 may be performed, for example, on an aircraft indicated generally in FIG. 2 by reference number 100. The aircraft 100 includes a control system 104 having one or more computers 108, one of which is shown in FIG. 2. The computer 108 has a processor 112 and memory 116. In some configurations the control system 104 may also include ground components in communication with the aircraft 100 via satellite and/or other media. The control system 104 receives and uses input from various sensors, including left-side and right-side angle-of-attack (AOA) sensors 120 mounted on the aircraft fuselage 124. Only the right-side AOA sensor is visible in FIG. 2. Each AOA sensor 120 has a probe 128 extending laterally from the fuselage 124. Various accelerometers, gyroscopes, position sensors, and other sensors, collectively referred to by reference number 132, provide signals used by the control system 104 during aircraft operation. One of the sensors 132, a pitch rate sensor 140, provides a signal indicative of a pitch rate of the aircraft 100.

In one exemplary implementation, spectral energy of a signal of one of the AOA sensors 120 is computed over a floating window of data samples. The spectral energy is evaluated for consistency with a substantially current state of the aircraft 100. Such evaluation is made based on a comparison of the AOA sensor spectral energy with spectral energy of the pitch rate sensor 140 signal, as further described below.

Generally, a frequency spectrum may be chosen for computation of signal energy of a given sensor in the following manner. For a given application in accordance with the disclosure, a frequency spectrum may be tailored to isolate a specific frequency spectrum of interest for the particular application. Accordingly, for a given sensor type, an anticipated bandwidth of a nominal sensor of that type would typically be considered in determining an upper boundary of the frequency spectrum, e.g., to account for sensor performance within the specification for that sensor type. A frequency spectrum lower boundary may be tailored to account for legitimate steady-state differences between the given sensor signal amplitude and signal amplitude associated with a system state indicator used for comparison with respect to the given sensor as further described below. The extent of such steady-state differences would depend upon the physical relationship between the sensor and the system state indicator. A frequency spectrum also may be chosen so as to eliminate any spectral energy components that could result from specific sensor failure modes of interest (e.g. oscillations at specific frequencies, etc.), or to avoid frequency regions associated with flexible airframe effects.

Computation of spectral energy of a signal may be performed in the time domain using band-pass (and possibly band-rejection) filtering and discrete integration. In the frequency domain, computation can be performed using Discrete Fourier Transforms (DFTs) of signals using Fast-Fourier Transform (FFT) methods. Computation of signal spectral energy in the frequency domain, although tending to be processing-intensive compared to time-domain methods, provides excellent spectral discrimination since only specific frequencies of interest are typically included in the computations. Time-domain methods are typically efficient relative to frequency-domain methods in terms of computer processing, although typically not as effective in providing real-time spectral discrimination. Real-time band-pass (or band-rejection) filtering typically involves the use of infinite impulse response (IIR) filters, which generally have a more gradual attenuation roll-off with respect to frequency. Both approaches are discussed in more detail below. In fault detection and isolation for non-real-time applications, finite impulse response (FIR) filters can be utilized. Although typically recursive and processing-intensive, FIR filters can be used to achieve nearly any spectral response.

Frequency Domain Methodology

Computation of signal spectral energy in the frequency domain may be performed as follows. The discrete Fourier transform (DFT) of a signal over a desired sample window (which may be floating or contiguous) is first computed using fast Fourier techniques (FFT). For some sensors, even non-contiguous windows spaced slightly apart over time could be utilized. A sample window including N time samples is indicated generally in FIG. 3A by reference number 200. The DFT may be determined over the sample window 200 in accordance with:

$$X_n = \sum_{k=0}^{N-1} x_s(k) e^{-j2\pi nk/N} \tag{1}$$

where k=0, 1, . . . , N−1 represents a time sample index and n=0, 1, . . . , N−1 represents a frequency index for N frequency points. A graph of a frequency domain amplitude spectrum is indicated generally in FIG. 3B by reference number 250. A region 254 indicates signal energy of interest. Energy spectral density (signal energy as a function of frequency) may be computed by taking the square of the amplitude of the resulting Fourier coefficients, i.e., in accordance with:

$$G_n = |X_n|^2 = X_n X_n^* = (Re(X_n))^2 + (Im(X_n))^2. \tag{2}$$

Signal energy within the desired frequency spectrum may be computed by integrating the energy spectral density over the frequency region of interest 254 in accordance with:

$$E = \int_{f=Min}^{f=Max} G(f)\, \partial f \tag{3}$$

where $f_{\_Min}$, and $f_{\_Max}$ represent the lowest and highest frequency of interest (e.g., 0.6 and 3.0 Hz respectively for an exemplary implementation described in this disclosure relating to an AOA sensor.)

Figure 3A:
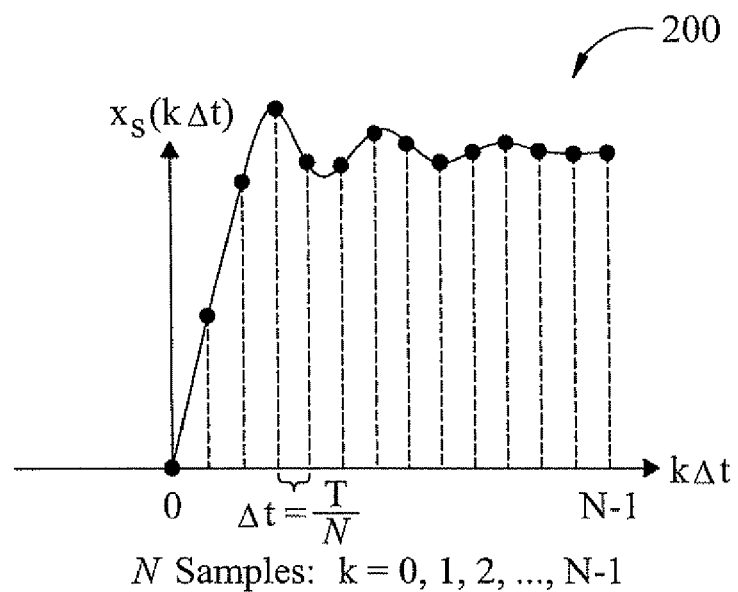
FIG. 3A is a graph of a window of signal samples in accordance with one implementation of the disclosure.
Figure 3B:
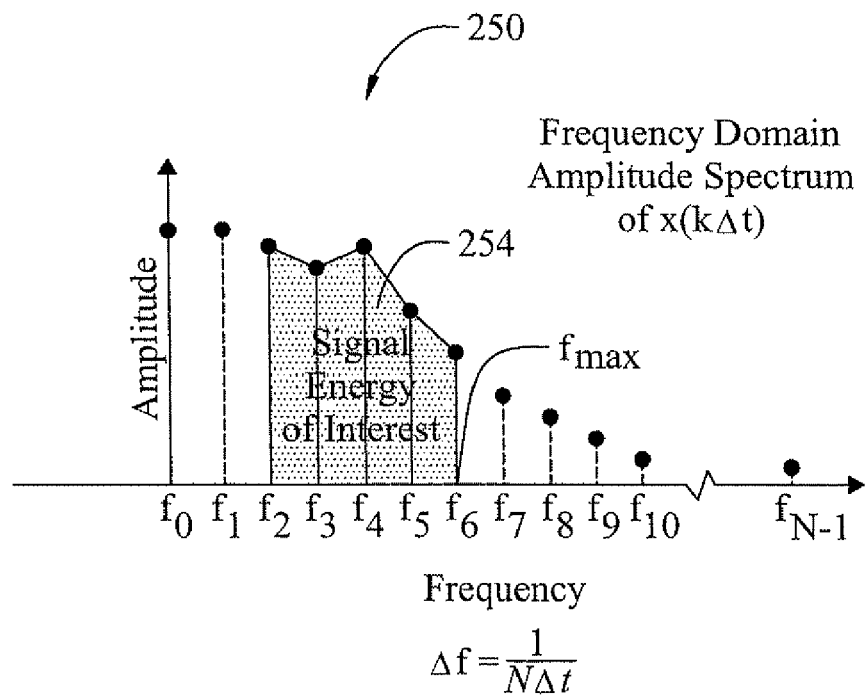
FIG. 3B is a graph of a frequency domain amplitude spectrum in accordance with one implementation of the disclosure.

As indicated in FIGS. 3A and 3B, frequency resolution is inversely proportional to sample window width and sample period. Smaller sample window widths or higher sample rates result in larger steps in frequency. Zero-padding the data to artificially increase the sample window width, however, can improve frequency resolution. Any signal discontinuities associated with the signal periodicity assumptions inherent in the DFT can result in a ringing in the frequency domain amplitude spectrum. This effect, commonly referred to as Gibbs effect, can be mitigated by windowing the input signal. Implementation of windowing functions preferably includes taking into account the fact that the use of such functions can actually modify the signal.

Time Domain Methodology

Parseval's Theorem for Fourier transforms states that the energy associated with a signal can be computed in either the time-domain or the frequency domain, as defined in the relationship:

$$E = \int_{-\infty}^{\infty} |x(t)|^2 \, dt = \int_{-\infty}^{\infty} |X(f)|^2 \, df \quad (4)$$

Signal energy within a certain frequency range can therefore be computed in the time-domain by first band-limiting the signal to the frequency range of interest, squaring the band-limited signal, and then integrating the result over the time duration of interest. Designing a band-pass filter typically includes taking into account the fact that spectral discrimination achieved through band-pass filtering of a signal in the time-domain typically is not as good as that achieved using the foregoing frequency domain methodology. This is especially true for real-time fault detection and isolation applications that implement infinite impulse response (IIR) filters. Whereas spectral discrimination provided by frequency domain methodology typically is infinite (where only discrete frequencies of interest are considered), IIR filters achieve a finite amount of roll-off. Finite impulse response (FIR) filters may be capable of achieving nearly any degree of spectral discrimination but typically involve recursive and computationally intensive processing (FIR filtering is typically performed using convolution).

The Gibbs effect tends to complicate the implementation of highly discriminating filters in the time domain. Filters exhibiting a high degree of spectral discrimination in the frequency domain (e.g., higher Q, or roll-off) also experience longer settling times in their time-domain step responses (the Gibbs effect describes how discontinuities in one domain result in ringing or oscillations in the other domain). Thus time-domain band-pass filters can be designed to achieve a crisp response in the frequency-domain (high spectral discrimination), or a crisp response in the time-domain (low settling times), but not both. Consequently, filters that achieve a high degree of spectral discrimination also exhibit longer settling times. The sudden step transition associated with an intermittent failure results in ringing in the output of such filters, which in turn results in large signal energies that tend to mask the failure and affect fault detection and isolation. Thus a high Q filter may be less desirable for a time-domain application. When a high degree of spectral discrimination is desired, it may be preferable to use frequency domain methodology.

Floating Energy Window Computation

Figure 4A:
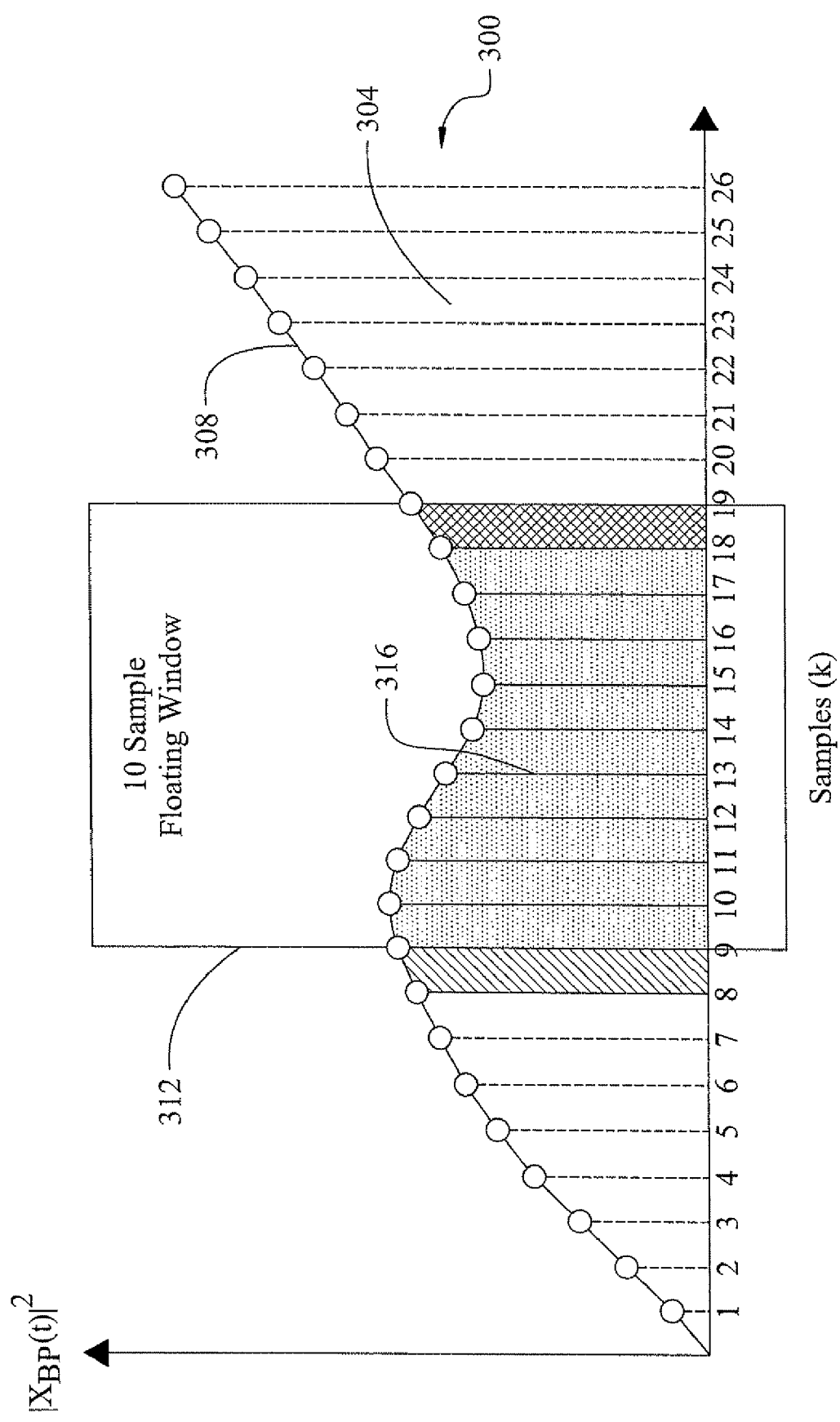
FIG. 4A is a graph of a floating window of signal samples in accordance with one implementation of the disclosure.

Compared to the foregoing frequency domain methodology, the foregoing time-domain methodology may lend itself more easily to implementing a "floating energy window" computation. That is, an energy window of fixed sample width may be used that is continuous in nature and is updated to account for each new sample of energy. A graph of samples is indicated generally in FIG. 4A by reference number 300. Consider a signal x(t) that has been band-passed filtered and squared as shown in FIG. 4A. The band-limited energy of x(t) for any desired window of samples is represented by an area 304 under a $|X_{BP}(t)|^2$ curve 308 for the desired sample interval. Delta-energy $\Delta E(k)$ for each sample entering a floating energy window 312 is represented by an area 316 under the $|X_{BP}(t)|^2$ curve 308 between sample k and sample k−1. For each sample entering the window 312, $\Delta E(k)$ can be computed using the Tustin Integration method:

$$\Delta E(k) = \Delta T|X_{BP}(k-1)|^2 + \Delta T(|X_{BP}(k)|^2 - |X_{BP}(k-1)|^2)/2 \quad (5)$$

$$= \Delta T(|X_{BP}(k)|^2 + |X_{BP}(k-1)|^2)/2$$

Figure 4B:
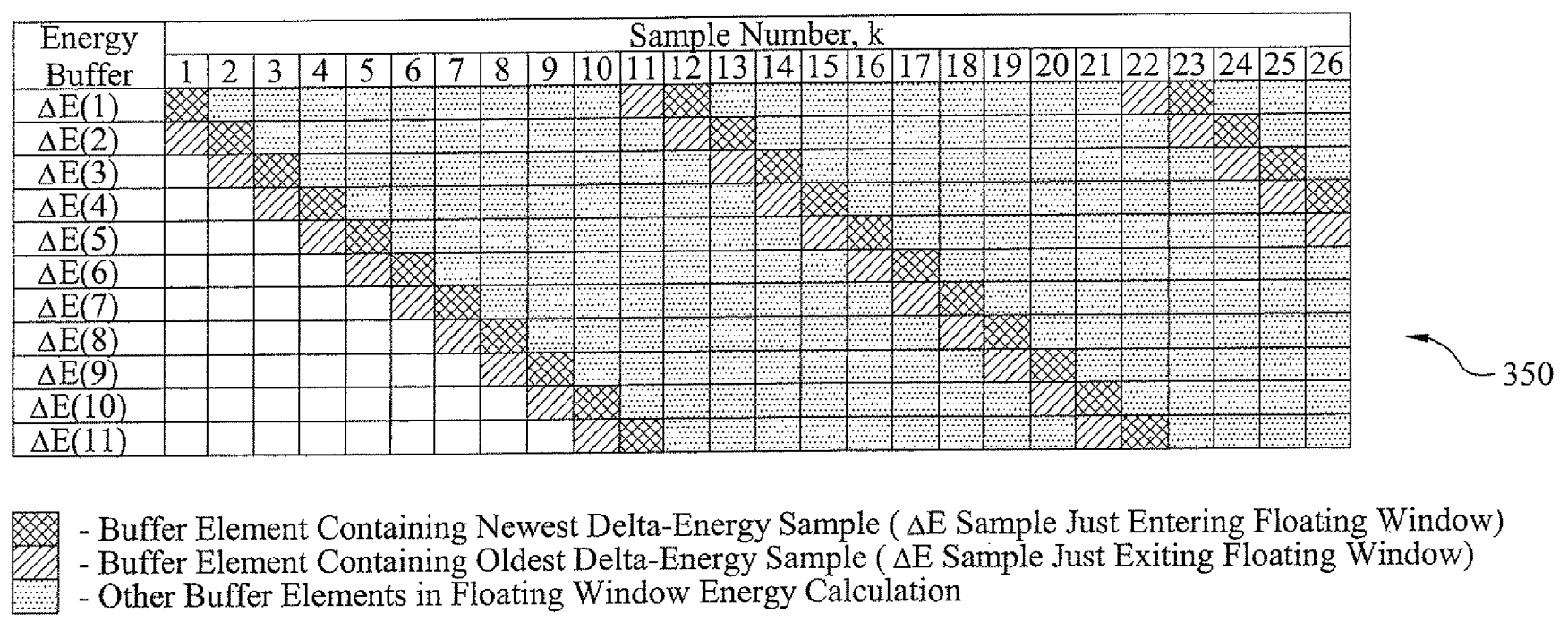

The floating energy window 312 can be efficiently implemented using a circular buffer of M+1 elements, where M is a desired sample-width of the floating window. A circular energy buffer for the window 312 is indicated generally in FIG. 4B by reference number 350. If an index is maintained to the "Newest $\Delta E$ Sample" (the sample just entering the floating window 312) and an index is maintained to the "Oldest $\Delta E$ Sample" (the sample just exiting the floating window 312), the band-limited energy E within the floating energy window 312 at any instant may be computed as:

$$E = E + \Delta E(I\text{Newest}) - \Delta E(I\text{Oldest})$$

Detecting and/or Isolating an Angle-of-Attack Sensor Fault

In the present exemplary implementation, spectral energy of a signal of a selected AOA sensor 120 is computed over a floating window of data samples sized, e.g., to optimize a fault detection/isolation response time while minimizing or eliminating nuisance AOA sensor fault indications. Using a short-duration floating window also may serve to minimize or eliminate effects (if any) of, e.g., sudden transitions in the sensor signal and large energy spikes that might be associated with them.

Signal energy associated with a local probe rate within a specific band of frequencies for the selected AOA sensor 120 may be compared to an approximation of the Equations-of-Motion (EOM) AOA rate for the aircraft 100. Motion of the aircraft 100 may be represented by the following relationship:

$$\dot{\alpha} = q - \frac{57.3 \, g}{V_T \cos\beta} \left[ \begin{array}{c} (N_Z - \cos\phi\cos\theta)\cos\alpha + \\ (N_X - \sin\theta)\sin\alpha \end{array} \right] - (p\cos\alpha + r\sin\alpha)\tan\beta \quad (6)$$

where $\alpha$ represents the AOA rate and q represents pitch rate.

If the energy of the local probe rate is significantly below that of the approximated EOM AOA rate (i.e., exhibiting a significantly degraded bandwidth compared to that of $\alpha$), the selected AOA probe 128 is isolated as being failed. The foregoing process may be performed for both the left and right local AOA probes 128, accounting for conditions, e.g., where the probes would not be expected to be responding. Such conditions could include low airspeed conditions, take-off and landing conditions, extreme high and/or low AOA readings, e.g., when the probes 128 have reached their limits, and/or conditions where the aircraft may have departed controlled flight.

Figure 5:
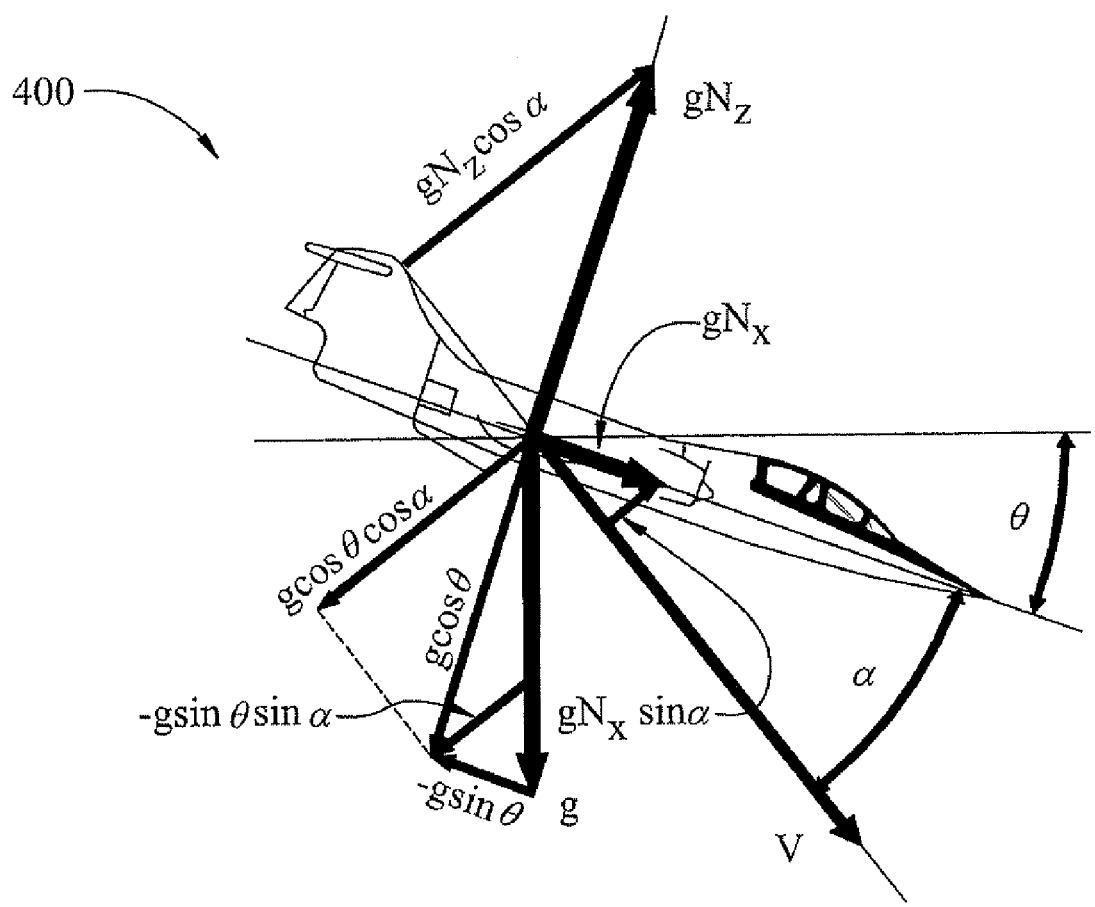
FIG. 5 is a diagram of projection of components of angle-of-attack rate for an aircraft in flight.
Figure 6A:
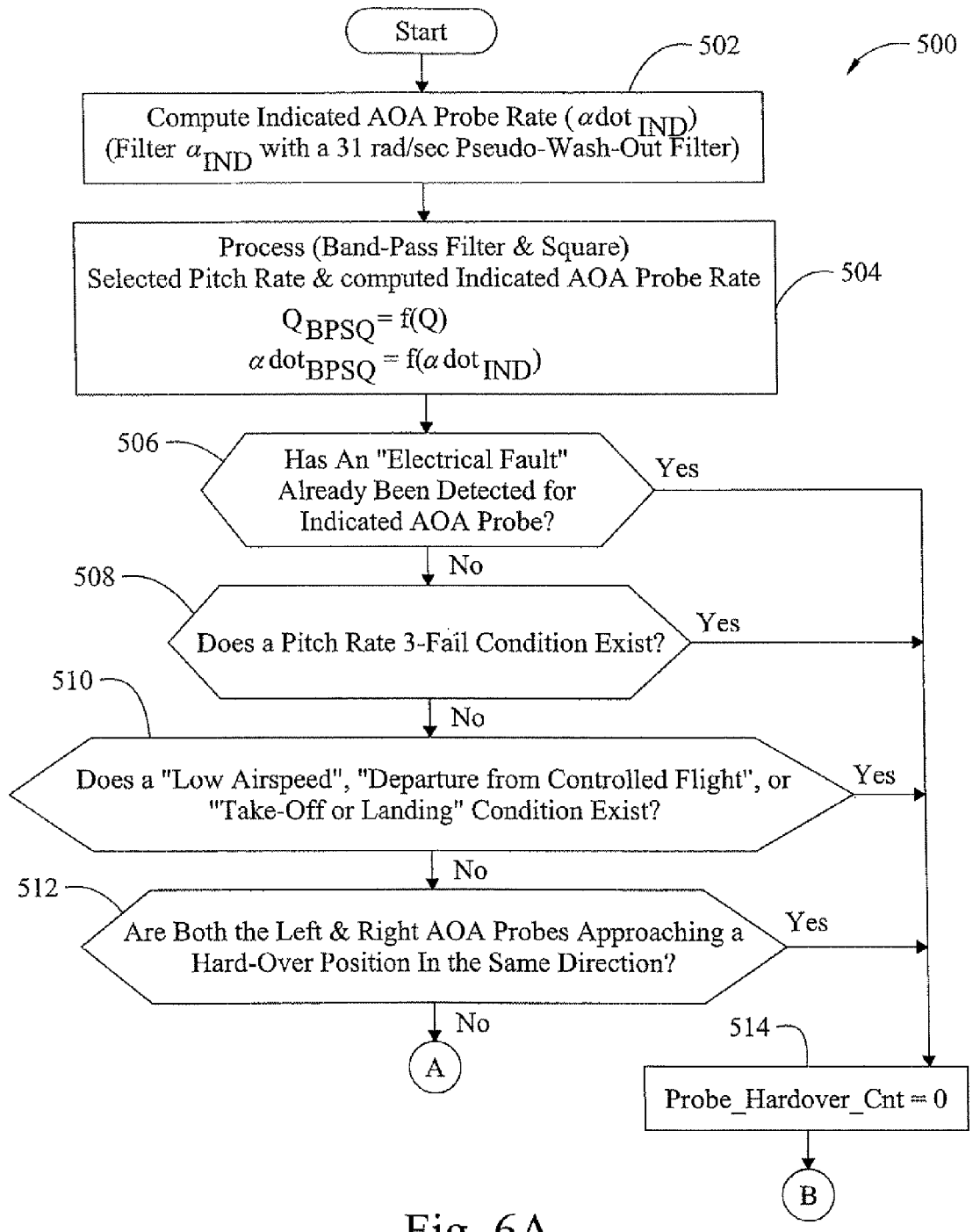
FIGS. 6A-6D are a flow diagram of a method of detecting and/or isolating a fault of a sensor in a system in substantially real time in accordance with one implementation of the disclosure.
Figure 6B:
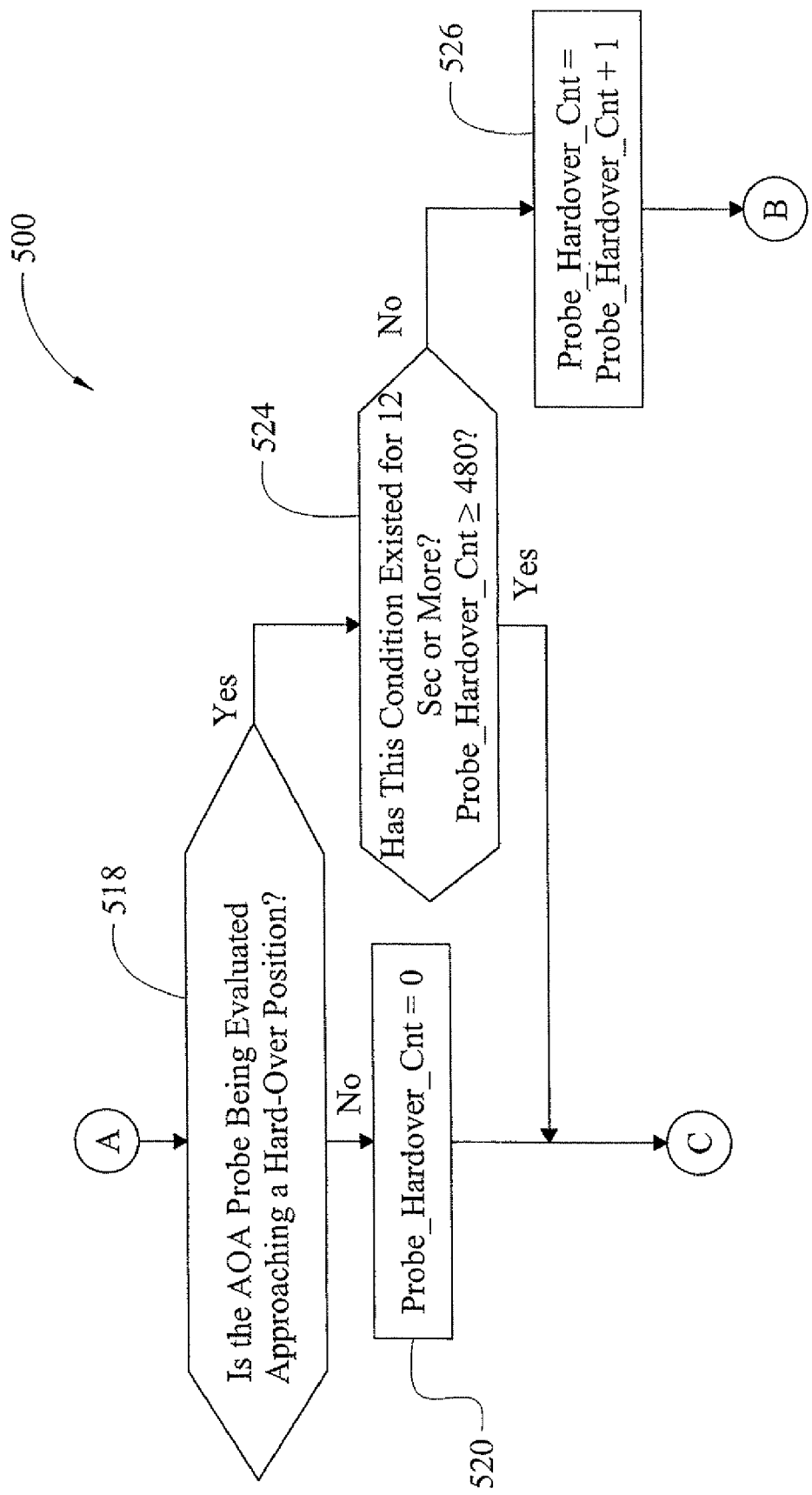
Figure 6C:
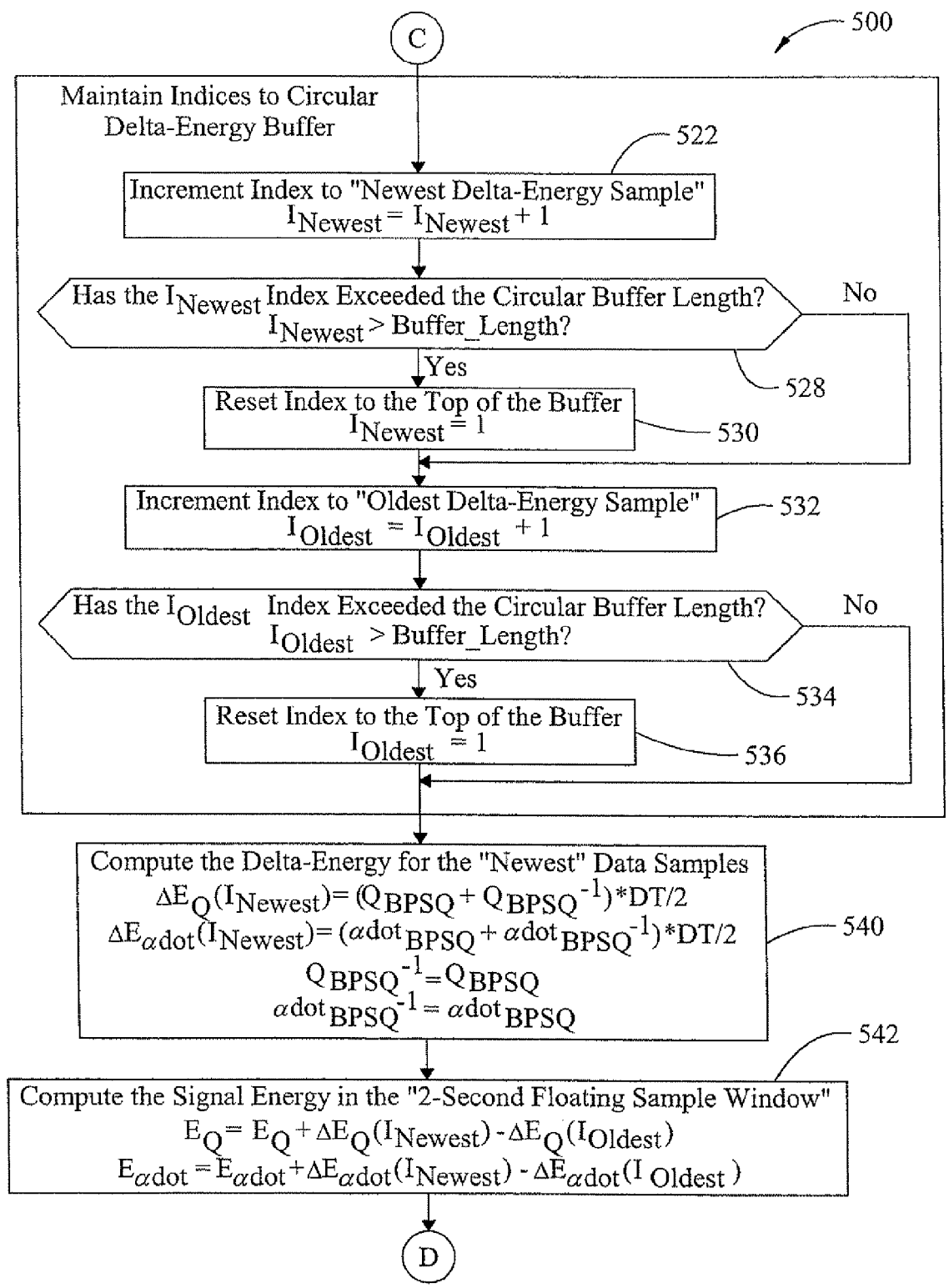
Figure 6D:
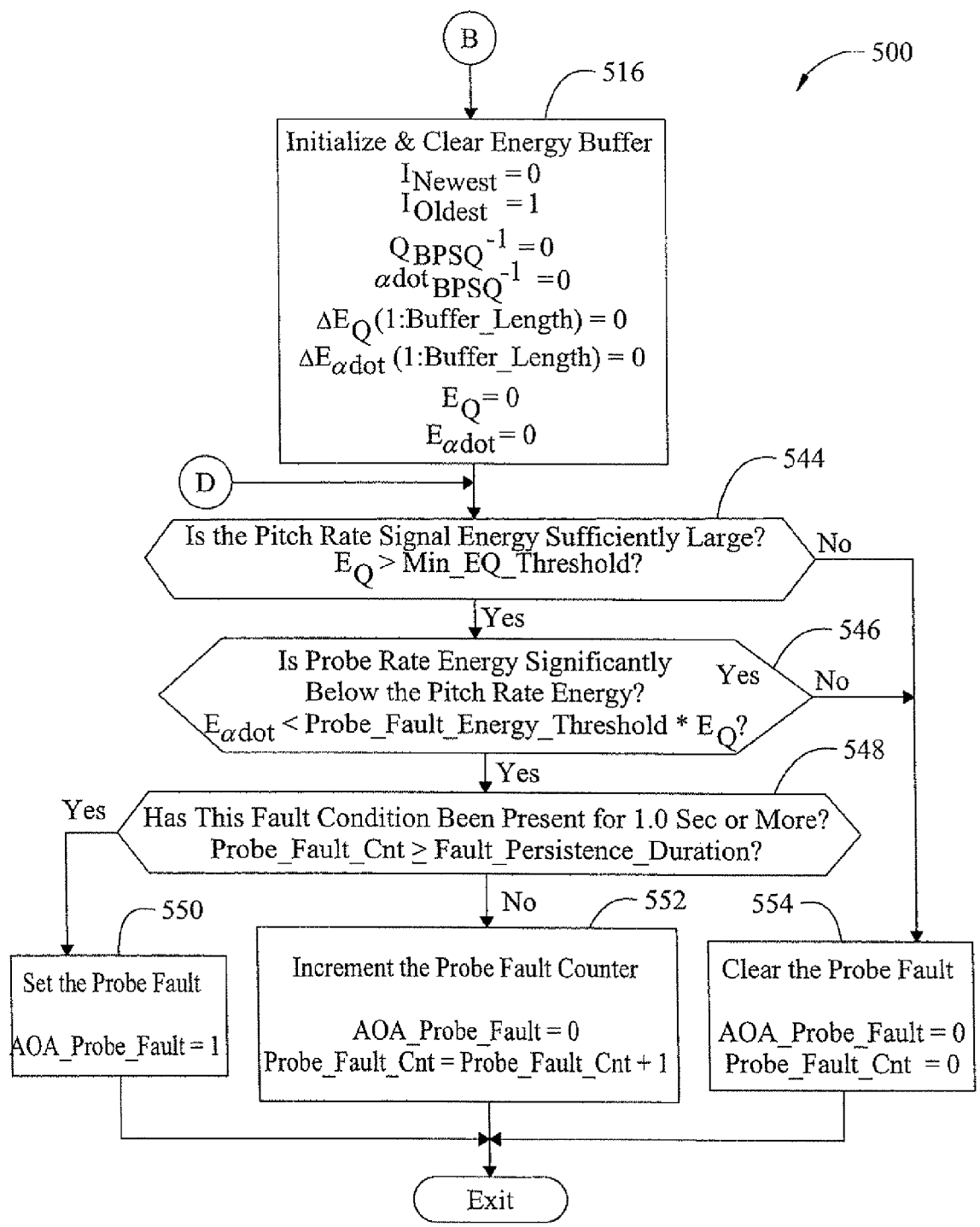

A diagram of projection of components of $\alpha$ is indicated generally in FIG. 5 by reference number 400. In view of the foregoing EOM AOA rate equation (6), it is apparent that energy in an AOA rate signal would have cumulative energy components from pitch rate (q), body-axis accelerations ($N_x$, $N_z$), true airspeed ($V_T$), Euler angles ($\theta$, $\emptyset$), angle-of-attack ($\alpha$) and sideslip ($\beta$), as well as body axis roll and yaw rates (p,r). Components in the second term on the right side of equation (6) all resolve perpendicular to the velocity vector (V) and represent the pitch rate necessary for the aircraft 100 to maintain its orientation with the velocity vector rotation, i.e., maintain a constant angle-of-attack. Pitch rates in excess of this amount are referred to as excess pitch rate and result in an increase in AOA rate. Therefore, one would intuitively expect the excess pitch rate to have a bandwidth very similar to pitch rate.

Components in the third term on the right side of equation (6) represent body rates that are not about the velocity vector and which occur during uncoordinated rolls. Consequently, spectral energy associated with pitch rate (q) can provide a minimum approximation to spectral energy contained in the "true" AOA rate. Further, by eliminating from the energy computation lower frequencies that are closer to steady-state (i.e., frequencies that correlate more to the amplitude of the signal rather than its dynamic variation), errors in the AOA rate energy approximation induced by steady-state energy differences between pitch rate and AOA rate can be eliminated. Such differences may occur, for example, during a steady-state pull-up with zero excess pitch rate, and hence zero AOA rate ($\alpha$) but non-zero pitch rate (q).

In some implementations, a time-domain-based floating sample window of fixed duration may be used. A sample time may be selected that is sufficiently short to quickly isolate a sensor failure of relatively short duration (for example, if a sensor probe 128 binds during a catapult launch), and also long enough to include a sufficient sample of rigid-body aircraft dynamics to avoid nuisance fault indications. Accordingly, in some aircraft, a floating sample window width of 2 seconds may be used.

A flow diagram of one exemplary implementation of a method of detecting and/or isolating a sensor fault in real time is indicated generally in FIGS. 6A-6D by reference number 500. The method 500 may be performed periodically, e.g., at 40 Hertz on the aircraft 100 to monitor performance of the AOA sensors 120. In process 502, an indicated AOA probe rate for the AOA probe 128 being evaluated is computed and filtered as further described below. In process 504, the pitch rate signal and the AOA probe rate are band-pass filtered and squared, also as described below.

In process 506 it is determined whether an electrical fault has been detected for the indicated AOA probe being evaluated. In process 508 it is determined whether the pitch rate signal has failed. In process 510 it determined whether a "low airspeed", "departure from controlled flight", or a "take-off or landing" condition exist. In process 512 it is determined whether both the left and right AOA probes 128 are close to a hard-over position in the same direction. If any one of the processes 506, 508, 510 and 512 results in a "yes" determination, then control passes to a process 514 in which a hard-over counter for the AOA probe 128 being evaluated is set to zero. Control then passes to a process 516 (shown in FIG. 6D).

If processes 506, 508, 510 and 512 all result in "no" determinations, then control passes to a process 518 (shown in FIG. 6B) in which it is determined whether the AOA probe 128 being evaluated is close to a hard-over position. If not, then in process 520 the hard-over counter for the AOA probe 128 is set to zero. Control then passes to a process 522 (shown in FIG. 6C). Referring again to FIG. 6B, if the determination is yes in process 518, then in process 524 it is determined whether the close-to-hard-over condition has existed for a predefined time period, e.g., for 12 or more seconds, and whether the hard-over counter for the AOA probe 128 has reached or exceeded a predefined value, e.g., 480. If yes, then control passes to process 522; otherwise in process 526 the hard-over counter for the AOA probe 128 is incremented and control passes to process 516 (shown in FIG. 6D).

In processes 522, 528, 530, 532, 534 and 536, indices to a circular "delta-energy" buffer are incremented, tested and/or reset to maintain the buffer as previously described. In process 540 changes in energy are computed for the "newest" data samples for the selected pitch rate signal and for the AOA probe rate signal. In process 542, signal energy in the floating sample window is computed for the selected pitch rate signal and for the AOA probe rate signal. In process 544 (shown in FIG. 6D), it is determined whether the pitch rate signal energy meets a minimum threshold value (referred to as Min_EQ_Threshold). If yes, then in process 546 the AOA probe rate energy is evaluated relative to the pitch rate signal energy. The sensitivity of this comparison is controlled through the use of a "Probe Fault Energy Threshold" constant (Probe_Fault_Energy_Threshold), which is essentially a percentage of the pitch rate energy that the AOA probe rate energy must fall below before a fault will be declared. This constant will vary depending upon the application. In the exemplary application a value of 0.5 (or 50%) is utilized.

If the evaluation in process 546 indicates that the AOA probe rate energy is significantly less than the pitch rate signal energy, then in process 548 it is determined whether such condition has been present for a time period equal to or more than a predefined time period, e.g., for one second or longer. If yes, then in process 550 an AOA probe fault is indicated and control exits. If the determination is "no" in process 548, then in process 552 an AOA probe fault indicator is cleared, the AOA probe fault counter is incremented, and control exits. In process 516 the energy buffer is initialized and cleared, and control passes to process 544. If the determination is "no" in processes 544 or 546, then in process 554 the AOA probe fault indicator is cleared and the AOA probe fault counter is zeroed before control exits. In some implementations, if the pitch rate signal energy is determined to be less than the minimum threshold value Min_EQ_Threshold, energies of the left and right AOA probe rate signals may be compared with each other, e.g., to isolate a binding probe 128.

Filtering and Processing

The method 500 may be implemented using, e.g., a Chebyshev Type II, 6th Order IIR band-pass filter, with targeted stop-band frequencies of 0.12 and 5 Hz, and a stop-band attenuation of 60 dB. Type II implementation of a Chebyshev filter can eliminate ripple in the pass-band while allowing ripple in the stop-band. The filter may be implemented as a single section or as a plurality of sections that may be cascaded, e.g., to optimize performance given the available arithmetic precision of the processor(s) 112 (shown in FIG. 2).

In some AOA probe fault detection implementations in which signal energy is computed in the frequency-domain, a Parzen window function may be used. Low-frequency portions of signal energy may be eliminated to avoid differences related to the steady-state content of the signal energy, e.g., where the frequency content of the signal is of greater interest than its amplitude. High-frequency signal energy content may be eliminated, e.g., to avoid inclusion of any aero-servo-elasticity (ASE) signal content present in pitch rate feedback, and to eliminate signal energies beyond the bandwidth of a nominal AOA probe.

In the method 500, the AOA probe rate may be computed using pseudo-washout filtering of the AOA probe signals, e.g., using a 31-radian-per-second (5 Hz) pseudo-washout filter. Such filter may be used to allow for a non-unity high-frequency gain in order to maintain a "true differentiator" throughout a band-width of interest. A roll-off frequency of the filter may be chosen for consistency with the upper stop frequency (in the foregoing example, 5 Hz) utilized on the band-pass filter, as well as to attenuate any structural mode activity on the local AOA probe signal induced by pitch rate (e.g., local air flow on the probe due to q). An exemplary transfer function for the pseudo-washout filter is $$G(s) = \frac{31s}{s+31}.$$

Minimum Pitch Rate Energy Threshold

AOA probe fault isolation in accordance with the disclosure is implemented while the aircraft is maneuvering. Comparing energy of the left and/or right AOA probe 128 rates with that of an EOM AOA rate (as approximated by pitch rate energy) is substantially accurate due to rigid-body energy present in the signals. Energy in the corresponding signals induced by turbulence is taken into account to prevent such energy from causing the control system 104 to erroneously isolate a fault. Specifically, a minimum pitch rate energy threshold (Min_EQ_Threshold) is implemented, e.g., as described in the method 500 to ensure that the aircraft 100 is adequately maneuvering. A preliminary threshold may be determined by modeling the turbulence effect on pitch rate as a normally distributed noise, e.g., with a first standard deviation of 1.2 deg/sec (or 3.6 deg/sec 3-$\sigma$). Energy associated with this "turbulence" may then be computed, e.g., in the two-second floating energy window. Based upon such analysis, an initial value for Min_EQ_Threshold may be determined. In the present exemplary method, the preliminary threshold was determined to be 0.35 deg$^2$/sec. The threshold was later fine-tuned, for example, using flight data from various fleet AOA failure events to a value of 0.30 deg$^2$/sec. In such manner, a compromise may be made between detecting AOA probe faults in the presence of low pitch rate energy and encountering nuisance fault indications.

The present disclosure may be implemented in relation to many different applications. For example, for Pitot-static probes (for total and static pressure), total and static pressure spectral energies could be evaluated relative to spectral energies of inertial velocity and altitude respectively. For a sideslip probe, the sideslip rate spectral energy could be evaluated relative to spectral energy of stability axis yaw rate ($r_{stab}$=r*cos($\alpha$)−p*sin($\alpha$), where r and p represent body axis yaw rate and body axis roll rate, respectively.)

For Euler angles, the spectral energy of Euler angle rates could be evaluated relative to spectral energy of body axis rates (or vice versa) in accordance with the following relationships:

$$\begin{bmatrix} \dot{\phi} \\ \dot{\theta} \\ \dot{\psi} \end{bmatrix} = \begin{bmatrix} 1 & \tan\theta\sin\phi & \tan\theta\cos\phi \\ 0 & \cos\phi & -\sin\phi \\ 0 & \sec\theta\sin\phi & \sec\theta\cos\phi \end{bmatrix} \begin{bmatrix} p \\ q \\ r \end{bmatrix}$$

$$\begin{bmatrix} p \\ q \\ r \end{bmatrix} = \begin{bmatrix} 1 & 0 & -\sin\theta \\ 0 & \cos\phi & \cos\theta\sin\phi \\ 0 & -\sin\phi & \cos\theta\cos\phi \end{bmatrix} \begin{bmatrix} \dot{\phi} \\ \dot{\theta} \\ \dot{\psi} \end{bmatrix}$$

The present disclosure may also be implemented in relation to many non-aerospace-related applications. For example, in a process control system, the physical relationship PV=nRT may be utilized in evaluating the spectral energies of pressure (P), volume (V), and/or temperature (T) relative to one another.

Implementations of the foregoing systems and methods make it possible to quickly detect and/or isolate a sensor failure. Subtle degradations can be detected in sensor dynamics that cannot be detected using signal amplitude techniques, thereby allowing a fault to be corrected before a hard-over failure of the sensor occurs. A failure can be isolated to a specific sensor without requiring comparisons to similar redundant sensors.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A method implemented using a processor of detecting and/or isolating a fault of a sensor in a system, the method comprising:
    using the processor to determine a total spectral energy of a signal of the sensor over a predetermined range of frequencies within a single window of samples of the signal, the sensor configured to measure a first state indicator of a state of the system, the state defined by a plurality of state indicators including at least the first state indicator and a second state indicator different from the first state indicator;
    comparing the determined total spectral energy with a spectral energy of a signal representing the second state indicator, where the energy of the signal representing the second state indicator is present within the single window of samples, and regardless if the signals are periodic or aperiodic; and
    based on the comparing and on a predetermined relationship between dynamic variation of the first state indicator and dynamic variation of the second state indicator, evaluating performance of the sensor.

2. The method of claim 1, further comprising evaluating the determined spectral energy relative to energy of a signal of another sensor of the system.

3. The method of claim 1, wherein the sample window includes one of the following: a floating window, a contiguous window, and a non-contiguous window.

4. The method of claim 1, wherein the determining and comparing are performed in the time domain, the method further comprising determining the total spectral energy within a single floating window using a circular buffer.

5. The method of claim 1, wherein the determining and evaluating are performed in at least one of the following: the frequency domain, and the time domain.

6. The method of claim 1, wherein the system includes an aircraft, the sensor includes an angle-of-attack sensor, and the comparing comprises evaluating the spectral energy relative to a pitch rate signal of the aircraft.

7. The method of claim 1, performed in substantially real time.

8. An apparatus for detecting and/or isolating a fault of a sensor in a system, the apparatus comprising a processor and memory configured to:
    determine a total spectral energy of a signal of the sensor over a predetermined range of frequencies within a single floating window of samples of the signal, the sensor configured to measure a first state indicator of a state of the system, the state defined by a plurality of state indicators including at least the first state indicator and a second state indicator different from the first state indicator;

determine a total spectral energy of a signal representing the second state indicator of the system state, the total spectral energy of the signal representing the second state indicator being present within the single floating window, and further regardless if the signals are periodic or aperiodic;

compare the total spectral energies; and based on the comparing and on a predetermined relationship between dynamic variation of the first state indicator and dynamic variation of the second state indicator, evaluate performance of the sensor.

9. The apparatus of claim 8, the system including an aircraft, the sensor including a slideslip probe, and the second state indicator including a stability axis yaw rate of the aircraft.

10. The apparatus of claim 8, wherein the processor and the memory are configured to perform the determining and evaluating in the time domain.

11. The apparatus of claim 8, wherein the processor and the memory are configured to perform the determining and evaluating in the frequency domain.

12. The apparatus of claim 8, wherein the system includes an aircraft, the sensor including an angle-of-attack sensor, the processor and memory configured to evaluate the spectral energy of the sensor relative to a pitch rate signal of the aircraft.

13. The apparatus of claim 8, wherein the processor and memory are configured to perform the determining and evaluating in substantially real time.

14. A non-transitory, tangible computer-readable medium containing computer instructions stored therein for causing a computer to detect or isolate a fault of a sensor in a system, the computer instructions comprises instructions operating to:

determine a total spectral energy associated with a signal of the sensor over a predetermined range of frequencies within a single window of samples of the signal, the sensor configured to measure a first state indicator of a state of the system, the state defined by a plurality of state indicators including at least the first state indicator and a second state indicator different from the first state indicator;

determine a total spectral energy of a signal representing the second state indicator of the current system state within the single window regardless if the signals are periodic or aperiodic;

compare the total spectral energies; and based on the comparing and on a predetermined relationship between dynamic variation of the first state indicator and dynamic variation of the second state indicator, evaluate performance of the sensor.

15. The non-transitory, tangible computer-readable medium of claim 14, wherein the system further includes an aircraft and the sensor includes a Pitot-static probe, the computer-readable medium further comprising instructions executable by a computer to:

compare total spectral energies of signals representing a total pressure and an inertial velocity; and compare total spectral energies of signals representing a static pressure and an altitude.

16. The computer-readable medium of claim 14, wherein the system includes an aircraft, the sensor including an angle-of-attack sensor, and the second state indicator including a pitch rate of the aircraft.

17. The non-transitory, tangible computer-readable medium of claim 14, wherein the single window includes at least one of the following: a floating single window, a contiguous single window, and a non-contiguous single window.

18. The non-transitory, tangible computer-readable medium of claim 14, further comprising instructions executable by a computer to perform the instructions periodically.

19. A method implemented using a processor of identifying a fault of a sensor in a system, the method comprising:

using the processor to determine a total spectral energy of a signal of the sensor over a predetermined range of frequencies within a single window of samples of the signal, the sensor configured to measure a first state indicator of a state of the system, the state defined by a plurality of state indicators including at least the first state indicator and a second state indicator different from the first state indicator;

comparing the determined total spectral energy with a spectral energy of a signal representing the second state indicator, where the energy of the signal representing the second state indicator represents a total spectral energy of the signal from the second state indicator over the predetermined range of frequencies; and based on the comparing and on a predetermined relationship between dynamic variation of the first state indicator and dynamic variation of the second state indicator, evaluating performance of the sensor.

* * * * *